(12) United States Patent
Nowak

(10) Patent No.: US 6,933,825 B2
(45) Date of Patent: Aug. 23, 2005

(54) GRADIENT COIL FOR A MAGNETIC RESONANCE TOMOGRAPHY APPARATUS, AND METHOD FOR PRODUCING SAME

(75) Inventor: Stefan Nowak, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 107 days.

(21) Appl. No.: 10/255,979

(22) Filed: Sep. 26, 2002

(65) Prior Publication Data

US 2003/0085789 A1 May 8, 2003

(30) Foreign Application Priority Data

Sep. 26, 2001 (DE) .......................................... 101 47 474

(51) Int. Cl.[7] .............................................. H01F 5/00
(52) U.S. Cl. ................................................. 336/200
(58) Field of Search ............................ 336/65, 83, 200, 336/205–208, 232

(56) References Cited

U.S. PATENT DOCUMENTS

| 4,748,429 A | 5/1988 | Aubert |
| 5,786,694 A | 7/1998 | Kilian et al. |
| 6,606,022 B1 * | 8/2003 | Taurand ...................... 336/200 |
| 2001/0035690 A1 | 11/2001 | Kato et al. |

FOREIGN PATENT DOCUMENTS

| EP | 0 701 700 | 11/2001 |
| JP | 59-35542 | 2/1984 |
| JP | 11-97244 | 4/1999 |
| JP | 2000-208327 | 7/2000 |

* cited by examiner

Primary Examiner—Tuyen T Nguyen
(74) Attorney, Agent, or Firm—Schiff Hardin LLP

(57) ABSTRACT

A gradient coil for use in magnetic resonance tomography is assembled from electrically conductive elements that each define a plane and that are arranged such that these planes lie parallel to one another. These elements are connected in a coil-forming fashion to electrically conductive spacers and in a stabilizing fashion to electrically insulating spacers.

8 Claims, 3 Drawing Sheets

GRADIENT COIL FOR A MAGNETIC RESONANCE TOMOGRAPHY APPARATUS, AND METHOD FOR PRODUCING SAME

BACKGROUND OF THE INVENTION

1. Field of the Invention

The present invention relates in general to a gradient coil as used in magnetic resonance tomography (MRT). The present invention relates to a method for producing a gradient coil.

2. Description of the Prior Art

MRT is based on the physical phenomenon of nuclear spin resonance and has been used successfully as imaging method for about 15 years in medicine and in biophysics. In this method of examination, the object is exposed to a strong, constant magnetic field. This aligns the nuclear spins of the atoms in the object, which were previously oriented irregularly. Radio-frequency waves can now excite these "ordered" nuclear spins to a specific oscillation (resonant frequency). In MRT, this oscillation generates the actual measuring signal (RF response signal) which is picked up by suitable receiving coils.

Having exact information as to the respective point of origin of the RF response signal (location information or location coding) is a precondition for the image reconstruction. This location information is obtained by additional magnetic fields (magnetic gradient fields) in relation to the static magnetic field along three spatial directions. These gradient fields are small by comparison with the main field and are produced by additional coils in the patient opening of the magnet. The overall magnetic field is different in each volumetric element owing to these gradient fields, and thus so is the resonant frequency. If a defined resonant frequency is emitted, it is thus possible to excite only those atomic nuclei that are at a location at which the magnetic field satisfies the appropriate resonance condition. It is possible by suitably changing the gradient fields for the location of such a volumetric element in which the resonance condition is satisfied to be displaced in a defined fashion, and thus to scan the desired region.

The method permits a free choice of the layer to be imaged, as a result of which it is possible to obtain tomographic images of the human body in all directions. MRT currently uses applications with high gradient performance which permit an excellent image quality with measuring times of the order of magnitude of seconds and minutes.

Continuous technical development of the components of MRT machines and the introduction of high-speed imaging sequences have created ever more fields of use for MRT in medicine. Real-time imaging for supporting minimally invasive surgery, functional imaging in neurology and perfusion measurement in cardiology are only a few examples.

The basic design of one of the central components of such an MRT apparatus is illustrated in FIG. 3. It shows a basic field magnet 1 (for example an axial superconducting air-coil magnet with active stray field screening) which generates a homogeneous magnetic basic field in one direction, for example, the z-direction, in the interior. The superconducting magnet 1 has, in its interior, superconducting coils which are located in liquid helium. The basic field magnet 1 is surrounded by a two-shell tank which is made from stainless steel, as a rule. The inner tank, which contains the liquid helium and serves in part also as a winding body for the magnet coils, is suspended at the outer tank, which is at room temperature, via fiberglass-reinforced plastic rods which are poor conductors of heat. A vacuum prevails between the inner and outer tanks.

The cylindrical gradient coil 2 in the interior of the basic field magnet 1 is inserted concentrically into the interior of a support tube by means of support elements 7. The support tube is delimited externally by an outer shell 8, and internally by an inner shell 9.

The gradient coil 2 has three component windings which generate respective gradient fields, proportional to the current impressed in each winding, and which are spatially perpendicular to one another. As illustrated in FIG. 4, the gradient coil 2 has an x-coil 3, a y-coil 4 and a z-coil 5, which are respectively wound around the coil core 6 and thus generate respective gradient fields, expediently in the direction of the Cartesian co-ordinates x, y and z.

The x-coil 3 and y-coil 4 are so-called saddle coils that, although overlapping one another in the end region, are generally rotated relative to one another by 90° with reference to the z-axis. The z-coil 5 constitutes a conventional Maxwell coil.

The conventional method for producing these individual gradient coils—in particular the saddle coils—is very complicated, and is summarized as follows:

To date, the coils have been produced from commercially available enamel-insulated copper wire. The wire is wound to form the coil in special winding forms (two-dimensional in the case of saddle coils), and wound onto a support. Subsequently, the latter is bent into the shape corresponding, for example, to the saddle coil, and mounted on the gradient coil 2. In the next step, the coils are connected by appropriately soldering the coil ends. Lastly, the coils are subjected to a chilled casting in order to achieve the acquired mechanical stability.

This conventional method of production is time-consuming and cost-intensive.

SUMMARY OF THE INVENTION

An object of the present invention is to improve or simplify the structural design and the production of gradient coils.

This object is achieved in accordance with the invention in a macro-multilayer coil for producing a magnetic field that is assembled from electrically conductive elements that each define a plane and that are arranged such that these planes lie parallel to one another. The elements are connected by electrically conductive spacers in a coil-forming fashion, and are connected in a stabilizing fashion by electrically insulating spacers.

The coil can be assembled in a simple and rapid way owing to this design according to the invention.

In one embodiment, the elements and the spacers are arranged such that the macro-multilayer coil constitutes a Maxwell coil and/or the shielding coil constitutes a Maxwell coil.

In another embodiment, the macro-multilayer coil is constructed using serial interconnections of outer elements and inner elements by means of spacers such that the inner elements form a saddle coil and the outer elements form a shielding coil for this saddle coil. An extremely simple design of a saddle coil with an integrated shielding coil, also denoted as a segment coil, results.

Advantages result by virtue of the fact that the elements are planar punched parts, the elements are annular elements, and/or the elements are pierced at suitable points, and the spacers are generally pierced.

In order to be able to form an integrated shielding coil, the inner elements are annular elements that have radially outwardly pointing tongues at both ends.

For the purpose of mechanical stabilization, the elements and the spacers are clamped together via end rings over the entire coil length at the pierced points with the aid of electrically insulating rods.

It is advantageous, furthermore, for the elements and the electrically conducting spacers to be composed of copper or aluminum, and for the electrically insulating rods to be composed of fiberglass.

Also, according to the invention, a method for producing macro-multilayer coils suitable for a magnetic resonance tomography apparatus, has the following steps:

i) connecting electrically conductive elements to electrically conductive spacers, the elements each defining a plane and being arranged such that the planes lie parallel to one another, and the elements and spacers form a magnet-producing coil, ii) stabilizing the coil by disposing electrically insulating spacers at suitable points between the elements, and iii) clamping the elements and the spacers together at suitable points.

In a first embodiment of the method, the elements and spacers are arranged such that the macro-multilayer coil is constructed as a Maxwell coil or as a shielding coil of a Maxwell coil.

In a second embodiment of the method, the outer elements are serially interconnected to the inner elements by means of spacers such that the inner elements form a saddle coil, and the outer elements form a shielding coil of this saddle coil.

The method is advantageously characterized in by the elements being planar and punched, the elements being annular elements, and the elements being pierced at the suitable points, and the spacers are generally pierced. The elements can be cut by water jet or laser beam.

In order to be able to form a shielding coil for the saddle coil, the inner elements are annular elements that have radially outwardly pointing tongues at both ends.

The elements are pierced at suitable points—the spacers being pierced generally—in order for the purpose of achieving a prescribed mechanical stability, to allow them to be clamped together over the entire coil length via end rings at the pierced points with the aid of electrically insulating rods.

DESCRIPTION OF THE PREFERRED EMBODIMENTS

Figure 1:
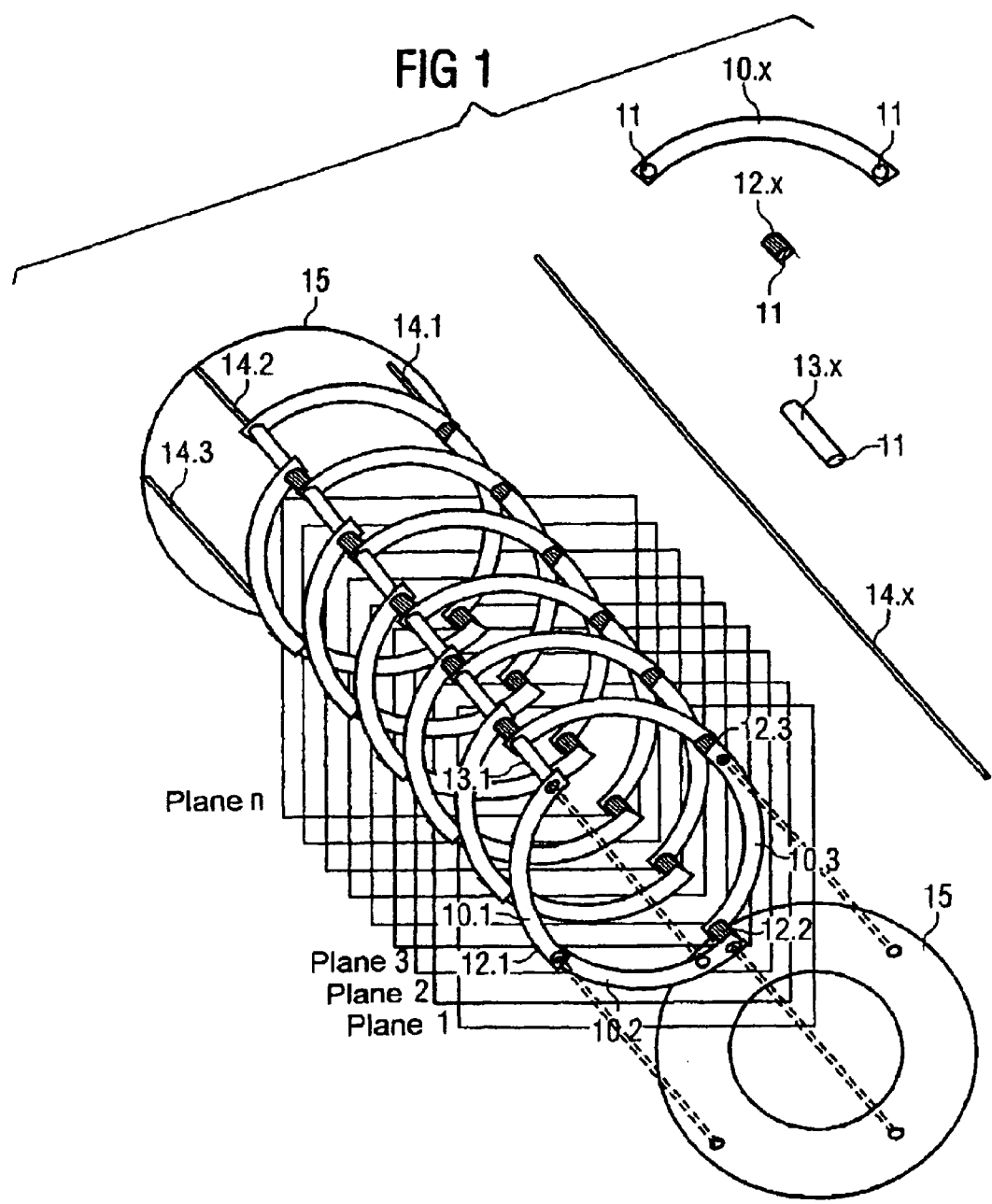
FIG. 1 shows the design according to the invention, of a z-coil.

FIG. 1 shows the design according to the invention of a z-coil (Maxwell coil). Each turn of this coil is decomposed in this exemplary embodiment into 4 elements 10.x, x=1 to 4. The elements 10.x are planar annular elements that are produced by punching, for example. Each element defines and therefore lies in a plane or layer; element 10.1 defines plane 1, element 10.2 defines plane 2, element 10.3 defines plane 3, etc.

The coil-shaped electrical connection of the individual elements 10.x is performed via spacers 12.x:

spacer 12.1 connects element 10.1 to element 10.2, spacer 12.2 connects element 10.2 to element 10.3, etc.

The electrically conducting material forming the elements 10.x and the spacers 12.x is copper or aluminum, for example.

In order to achieve a prescribed mechanical stability of the coil, the elements 10.x additionally are connected to the electrically conducting spacers 12.x with the aid of further spacers 13.x made from an electrically insulating material.

The elements 10.x, the electrically conducting spacers 12.x and the spacers 13.x are pierced at the locations 11 marked in the present exemplary embodiment. Consequently, these components can be aligned over the entire coil length on electrically insulating rods 14.x (for example glass fiber rods), and clamped together by means of the two end rings 15. The positions of the locations 11 and the end rings 15 define the position of the rods 14.x.

It is possible to increase the number of the piercing locations 11, and thus the number of the rods 14.x. The resonance behavior and the stiffness of the overall coil can be tuned by means of the number of the rods 14.x (it is also possible for there to be more than four), their position and the tensile stress. A chilled casting is therefore no longer required for the complete coil in order to achieve the greatest possible mechanical stability; only a short casting that insulates the coil electrically, but which contributes substantially to sound absorption or sound insulation.

Figure 2:
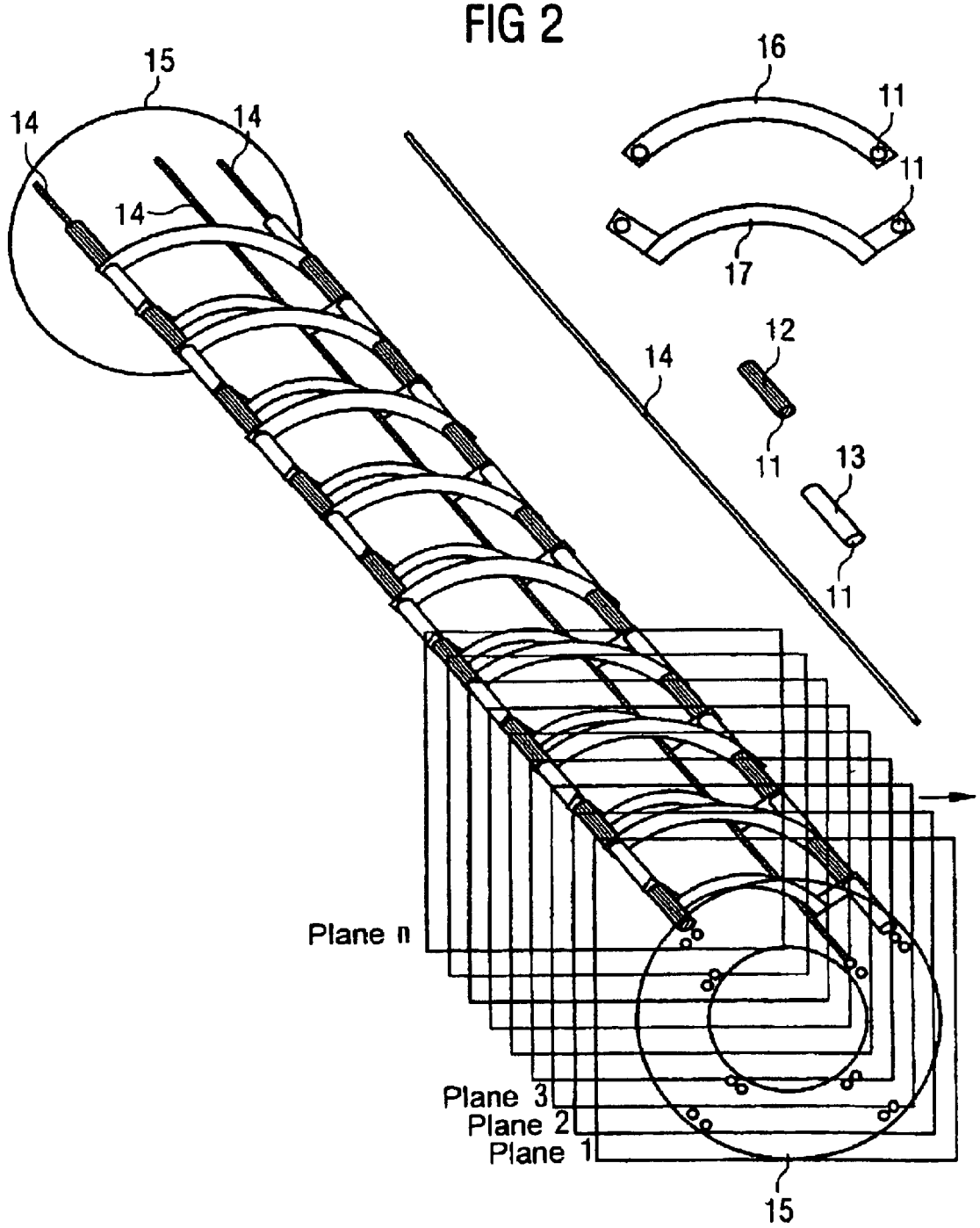
FIG. 2 shows the design, according to the invention, of a saddle coil as a segment coil using macro-multilayer technology, in this case a y-coil.
Figure 3:
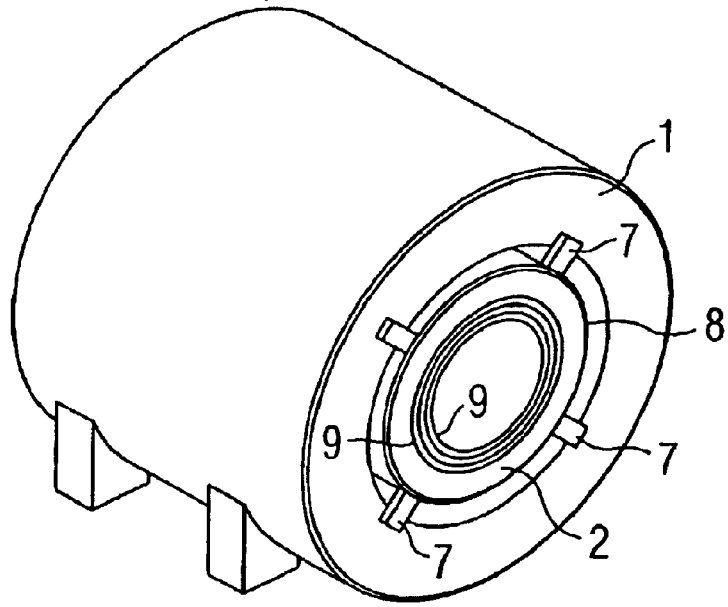
FIG. 3, as described above is a perspective illustration of a known basic field magnet.
Figure 4:
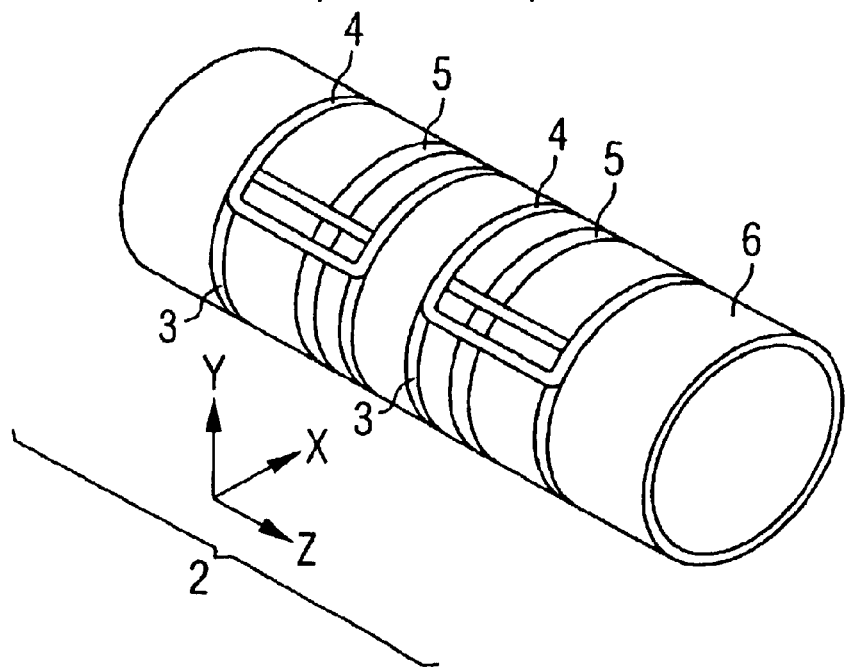
FIG. 4, as described above, is a perspective illustration of a known gradient coil with the three part-windings.

FIG. 2 shows the design according to the invention of a saddle coil as a segment coil, in this case a y-coil. This is constructed from elements in a fashion similar to the coil of FIG. 1, however, a difference is that two different elements 16 and 17 are used:

The element 16 is a planar annular element like the elements 10.x in FIG. 1. This component thus can be produced for both coils. Element 17 is, however, a planar annular element that has radially outwardly pointing tongues at both ends. Element 17 must be fabricated specially for the two saddle coils (x-coil and y-coil).

The reason for the different configuration of the elements 16 and 17 in FIG. 2 is that two coils nested one inside the other are formed by the serial interconnection illustrated in FIG. 2. The inner elements 16 constitute a saddle coil in their totality, while the outer elements 17 constitute in their totality the saddle-shaped shielding coil of the saddle coil formed by the elements 16.

Gradient coils are shielded in most cases in order to raise the field efficiency of the gradient field or to ensure that the latter is non-rotatable. The shielding coil is generally a further coil that is located at a radial distance of approximately 10 cm from the inner coil. This is the case both with Maxwell coils and with saddle coils. However, the shielding coils generally have fewer (10 to 20%) windings, and so the gradient coil illustrated in FIG. 2 and formed by the inner elements (17) must be combined (modularly interconnected, for example) with a conventional gradient coil.

The coil illustrated in FIG. 1 can, by contrast, be an unshielded Maxwell coil or even a shielding coil.

The elements 16, 17 and the spacers 12, 13 are mounted in an alternating fashion at the pierced locations 11 marked, or aligned on the rods 14. This results in a saddle-shaped coil whose components (elements and spacers) define a surface that encloses the volume of a circular-section cylinder.

The technology described in FIGS. 1 and 2 can be used to replace parts of the abovementioned, complicated coil production method by simpler methods (such as bracing, mounting). A further great advantage of the present invention is that the inventive technology can be used to nest a number of coils, for example having the same radii, and the corresponding connecting elements one inside the other. Modularly designed coils therefore can be mounted in a simple way, instead of using complicated winding methods.

Although modifications and changes may be suggested by those skilled in the art, it is the intention of the inventor to embody within the patent warranted hereon all changes and modifications as reasonably and properly come within the scope of his contribution to the art.

I claim as my invention:

1. A coil for producing a magnetic field, comprising:
    a plurality of electrically conductive elements each defining a plane, said elements being disposed with the respective planes defined thereby being oriented parallel to each other;
    a plurality of electrically conductive spacers electrically connecting said elements together in a coil configuration having a plurality of coil turns and a longitudinal length, each of said turns being formed by a set of said elements connected in series by a set of said electrically conductive spacers; and
    a plurality of electrically insulating spacers mechanically connecting said turns together in a stabilizing fashion with one electrically conductive spacer in each turn respectively alternating with said electrically insulating spacers along said longitudinal length.

2. A coil as claimed in claim 1 wherein said elements, said electrically conductive spacers and said electrically insulating spacers form a Maxwell coil.

3. A coil as claimed in claim 2 wherein said Maxwell coil approximates a helical coil.

4. A coil as claimed in claim 2 wherein said elements are annular elements.

5. A coil as claimed in claim 1 wherein each of said elements, said electrically conductive spacers and said electrically insulating spacers are pierced at respective locations with selected groups of said locations being in registration with each other.

6. A coil as claimed in claim 5 further comprising a plurality of electrically insulating rods respectively proceeding through said pierced locations in registration with each other to form an assembly having opposite ends, and end rings respectively disposed at said opposite ends of said assembly and clamping said assembly together.

7. A coil as claimed in claim 6 wherein said electrically insulating rods are comprised of fiberglass.

8. A coil as claimed in claim 1 wherein said elements and said electrically conductive spacers are comprised of an electrically conductive material selected from the group consisting of copper and aluminum.

* * * * *